United States Patent [19]

Van Den Brekel et al.

[11] Patent Number: 4,739,919

[45] Date of Patent: Apr. 26, 1988

[54] MASKING OF CIRCUIT BOARDS FOR WAVE SOLDERING

[75] Inventors: Jacques Van Den Brekel, Nepean; Hector Pitre, St. Pierre de Wakefield, both of Canada

[73] Assignee: Northern Telecom Limited, Montreal, Canada

[21] Appl. No.: 61,760

[22] Filed: Jun. 15, 1987

[51] Int. Cl.[4] .............................................. B23K 31/02

[52] U.S. Cl. .................................... 228/180.1; 228/39

[58] Field of Search ...................... 228/180.1, 39, 214, 228/180.2, 187; 118/406, 504

[56] References Cited

U.S. PATENT DOCUMENTS 4,421,265 12/1983 Boyer et al. ...................... 228/180.1
4,515,304 5/1985 Berger ................................ 228/187
4,678,531 7/1987 Metzger et al. ..................... 118/504

FOREIGN PATENT DOCUMENTS 0189069 10/1984 Japan ............................... 228/180.1

*Primary Examiner*—Nicholas P. Godici
*Assistant Examiner*—Karen Skillman
*Attorney, Agent, or Firm*—Sidney T. Jelly

[57] ABSTRACT

A soldering mask for soldering the leads of leaded components to a circuit pattern on a surface of a circuit board also having surface mounted components already soldered to the circuit pattern on that surface, comprises a flat metal plate having a recess in the top surface of the plate for reception of the circuit board. Cavities in the bottom surface of the recess house the surface mounted components. Openings through the plate from the bottom surface of the recess permit passage of leads and also permit access by the solder to solder the leads to the circuit pattern.

7 Claims, 2 Drawing Sheets

21 20 21 22 22 23 24 17 10 12 12 11 18 19 18 11

MASKING OF CIRCUIT BOARDS FOR WAVE SOLDERING

BACKGROUND OF THE INVENTION

1. Field of the Invention

This invention relates to the masking of circuit boards for wave soldering. In particular, the invention relates to the masking of circuit boards, and to the use of a mask, such that the leads of leaded components are exposed for soldering while surface mounted components are masked from the solder.

Circuit boards often have components mounted on both surfaces, and such components may be a mix of leaded components and surface mounted components. It therefore occurs that on a particular surface of a circuit board there will be surface mounted components soldered to the circuit pattern on that surface, and also the ends of leads extending through the board from components on the other surface, which ends are also to be soldered to the circuit pattern on the particular surface.

2. Related Art

Conventionally, the surface mount components are positioned first and soldered to the circuit pattern, as by reflow soldering. The board is then turned over and leaded components mounted by their leads being inserted into and through the board. The leads are then connected to the circuit pattern. Ideally, this would be done on an automated soldering line, by wave soldering. However, the presence of the surface mounted components creates problems.

SUMMARY OF THE INVENTION

The present invention provides masking of a circuit board by a metal mask which fits over the surface on which soldering of leads is to occur, the mask having openings right through for access to the leads for soldering. The mask also has cavities in which are positioned the surface mounted components already soldered to the board.

Broadly, the present invention provides a metal mask in the form of a metal sheet or plate having a recess in one surface for the reception of a circuit board. Openings extend through the mask, in the recess, for soldering access from the other surface. Cavities are formed in the bottom of the recess for housing components mounted on the circuit board.

BRIEF DESCRIPTION OF THE DRAWINGS

The invention will be readily understood by the following description of an embodiment, by way of example, in conjunction with the accompanying drawings, in which.

DETAILED DESCRIPTION OF THE DRAWINGS

Figure 1:
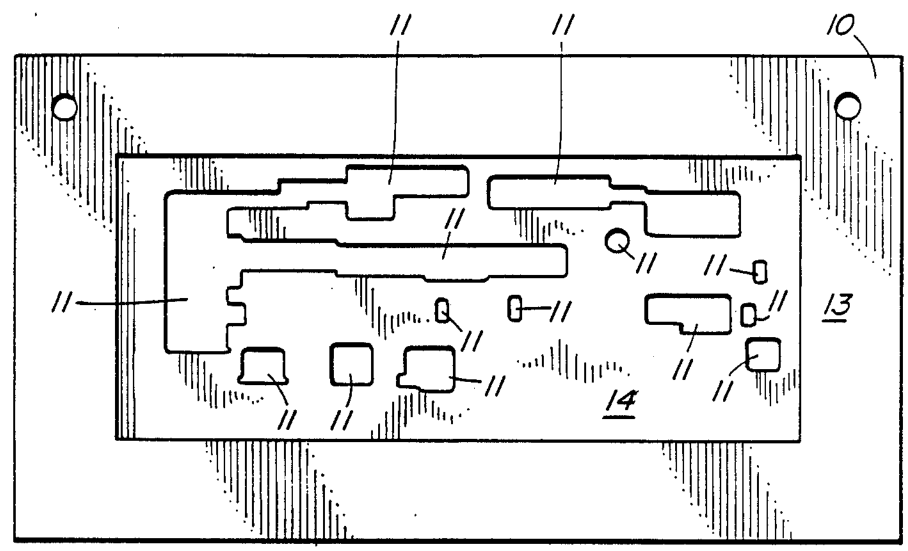
FIG. 1 is a top plan view of one form of mask, showing layout of cavities.
Figure 2:
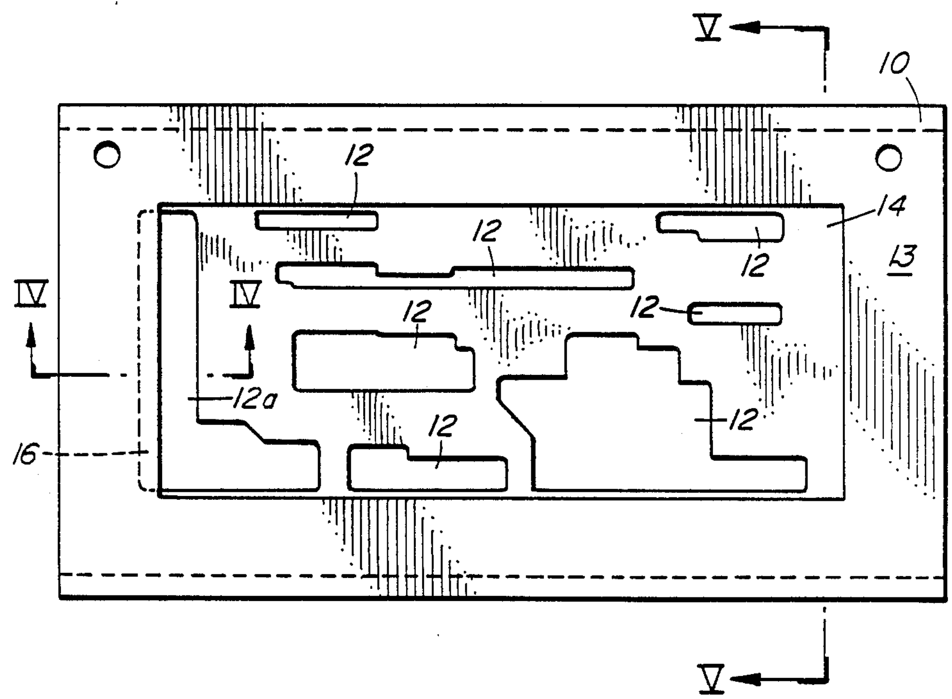
FIG. 2 is a top plan view of a mask as in FIG. 1, but showing the openings through the mask.
Figure 3:
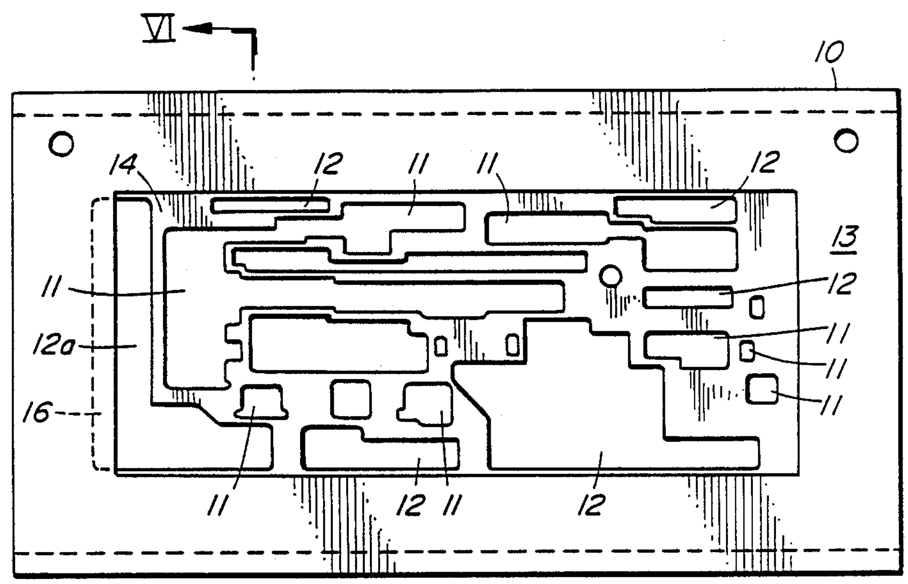
FIG. 3 is a top plan view of the mask as in FIGS. 1 and 2, with both cavities and openings shown.
Figure 4:
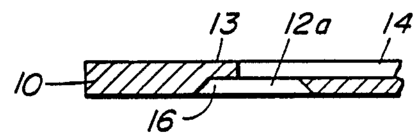
FIG. 4 is a cross-section on the line IV—IV of FIG. 2.
Figure 5:
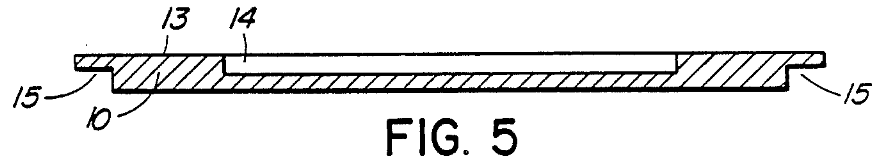
FIG. 5 is a cross-section on the line V—V of FIG. 2.
Figure 6:
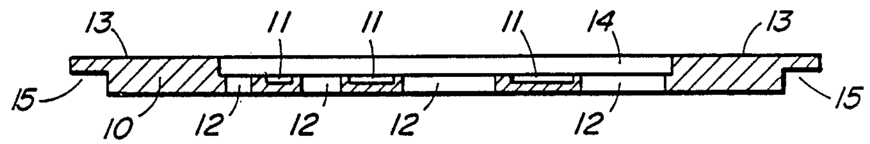
FIG. 6 is a cross-section on the line VI—VI of FIG. 3.

FIGS. 1, 2 and 3 illustrate a metal mask 10. For ease of description, and clarity, the openings and cavities formed in the mask have been shown separately in FIGS. 1 and 2. In FIG. 1, cavities 11 are shown, while in FIG. 2 openings 12 are shown. The mask, in the example, is of elongate rectangular form. The top surface 13 has a recess 14 formed therein, a circuit board fitting in the recess. The openings 12 extend right through the mask, from the bottom of the recess. The cavities 11 are formed in the bottom of the recess. This is illustrated in FIG. 6.

The mask is recessed along each side, on the bottom surface, at 15. The recesses 15 provide support and guidance for the mask along a track through a wave-soldering process.

A circuit board may have a connector mounted on one edge with terminals extending from the connector. The opening at the end of the recess 14 for the connector, designated as 12*a*, has an associated undercut or channel 16 in the bottom surface of the mask. Terminals extending from the connector can extend into the recess 16 and be given a coating of solder during the wave-soldering step.

Figure 7:
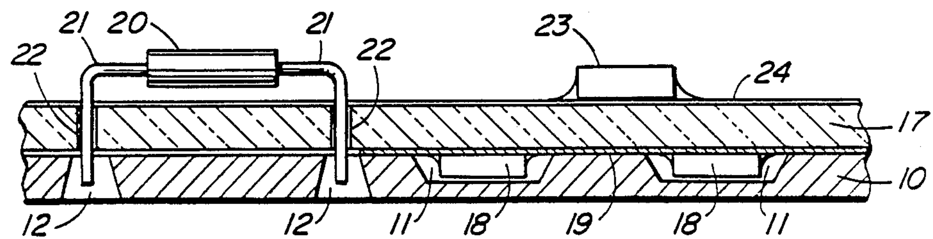
FIG. 7 is a diagrammatic cross-section through part of a circuit board and part of a mask, illustrating the application of a mask.

FIG. 7 illustrates the application of the mask. As shown in FIG. 7, a circuit board 17 rests in the recess of the mask 10, the board actually resting on the bottom surface of the recess. On the bottom surface of the board are mounted surface mount components 18. These are already soldered in position on a circuit pattern 19. On the top surface of the board a leaded component 20 is shown in position, the leads 21 extending down through holes 22 in the board and extending beyond the board. The components 18 are positioned in the cavities 11, while the leads 21 extend into openings 12. As the mask and board pass through the wave-soldering apparatus, the solder has access to the leads 21, and the circuit pattern 19 via openings 12, and the leads are soldered to the circuit pattern. The components 18 are shielded from the solder. Other components, for example surface mount component 23, can be mounted on the top surface of the board 17, to a circuit pattern 24.

In one example, the cavities have a depth of about 0.07 inches and about 0.06 inches, depending upon the size of components, with a thickness of 0.09 inches for the mask within the recess 14. There is a minimum distance between the edge of a lead and an adjacent edge of a surface mount component in order to provide a minimum wall thickness. In the example, this minimum distance is about 0.09 inches, which, allowing for clearance in the associated cavity and the opening for the lead, gives a minimum wall thickness of 0.037 inches. Where this minimum distance cannot be met, a blind hole, or blind holes, can be provided for leads. A further soldering operation would then be required.

To provide sufficient strength to the mask, particularly to avoid warpage, it is desirable that a continuous web, or a series of such webs, extend across the recess 14. This does occur in the arrangement of FIGS. 2 and 6.

Having finished the design layout of the holes and cavities, it is useful to enlarge the cavities where possible. This improves the insulation of the surface mounts and their solder joints, and also avoids large localized volumes of metal which can lead to warping. A typical material for the mask is anodized aluminum.

What is claimed is:

1. A metal mask for masking components on a circuit board, during wave soldering, said mask comprising a thin flat metal plate, a recess in a top surface of the plate for reception of a circuit board, a plurality of cavities in a bottom surface of said recess, said cavities being positioned to house components mounted on the circuit board, and a plurality of openings extending through the mask from the bottom surface of said recess to a bottom surface of said plate for passage of component leads therethrough, whereby on passage of the mask and a circuit board through a wave soldering apparatus, solder has access to said leads in said openings and is masked from said components mounted on said surface of said circuit board.

2. A mask as claimed in claim 1, at least some of said cavities being of a size to house a plurality of components.

3. A mask as claimed in claim 1, at least one of said openings being of a size for the passage of a plurality of leads.

4. A mask as claimed in claim 1, said cavities being positioned to house surface mounted components.

5. A mask as claimed in claim 1, a wall extending between each hole and an adjacent cavity, said wall having a minimum thickness of at least 0.03 inches.

6. A mask as claimed in claim 1 for a circuit board having a connector at one edge, including a further opening at one edge of said recess extending through the mask from said bottom surface of said recess, and a channel in said bottom surface of said plate, said clearance extending from said further opening away from said recess, whereby terminals in a connector can extend into said channel and receive a coating of solder during wave soldering.

7. A method of soldering leads of leaded components on a surface of a circuit board having surface mounted components on said surface, comprising; positioning the circuit board in a recess in a flat metal plate, said plate having cavities in a bottom surface of the recess for housing surface mounted components and openings through the plate from said bottom surface, leads from leaded components extending through said openings; and passing said plate and said circuit board through a wave soldering apparatus, whereby solder reaches said leads and solders said leads to contact positions on said circuit board, and the surface mounted components are masked from said solder.

* * * * *